(12) United States Patent
Wang et al.

(10) Patent No.: US 12,188,962 B2
(45) Date of Patent: Jan. 7, 2025

(54) AMPLITUDE-MODULATING PROBE CARD AND ITS PROBE AND AMPLITUDE-MODULATING STRUCTURE

(71) Applicant: MAXONE SEMICONDUCTOR CO., LTD., Jiangsu (CN)

(72) Inventors: Ailin Wang, Suzhou (CN); Liangyu Zhao, Suzhou (CN)

(73) Assignee: MAXONE SEMICONDUCTOR CO., LTD., Suzhou (CN)

( * ) Notice: Subject to any disclaimer, the term of this patent is extended or adjusted under 35 U.S.C. 154(b) by 135 days.

(21) Appl. No.: 18/031,215

(22) PCT Filed: Jul. 27, 2021

(86) PCT No.: PCT/CN2021/108631
§ 371 (c)(1),
(2) Date: Apr. 11, 2023

(87) PCT Pub. No.: WO2022/073375
PCT Pub. Date: Apr. 14, 2022

(65) Prior Publication Data
US 2023/0384348 A1    Nov. 30, 2023

(30) Foreign Application Priority Data
Oct. 11, 2020    (CN) .......................... 202011081026.5

(51) Int. Cl.
*G01R 1/07*    (2006.01)
*G01R 1/073*    (2006.01)
(Continued)

(52) U.S. Cl.
CPC .......... *G01R 1/07342* (2013.01); *G01R 1/20* (2013.01); *G01R 31/2889* (2013.01)

(58) Field of Classification Search
CPC .. G01R 1/07342; G01R 1/20; G01R 31/2889; G01R 31/2887
See application file for complete search history.

(56) References Cited

U.S. PATENT DOCUMENTS

9,194,886 B2 *   11/2015   Sato .................... G01R 1/07357
2004/0189332 A1 *   9/2004   Liang .................. G01R 1/07392
                                      324/750.25
(Continued)

*Primary Examiner* — Alvaro E Fortich
(74) *Attorney, Agent, or Firm* — Oliff PLC (57) ABSTRACT

A probe card has a probe, probe and circuit boards, and amplitude-modulating structure. The probe is fixed on the probe board, one end is connected to the circuit board, and the other end is clamped on the amplitude-modulating structure. The probe is equipped with a bent wire to make longitudinal elastic deformation for the probe, and the probe head is equipped with an amplitude-modulating board. The amplitude-modulating board is driven by an eccentric roller, which can achieve upward and downward movement of the amplitude-modulating board, thereby driving the probe to deform, causing the probe head of the probe to move from the detection position to the ready position, or from the ready position to the detection position, so that the number of probes in the detection position can be adjusted to enable to adjust the detection amplitude of a single probe card, making the probe card universal.

9 Claims, 6 Drawing Sheets

(51) Int. Cl.
*G01R 1/20* (2006.01)
*G01R 31/28* (2006.01)

(56) References Cited

U.S. PATENT DOCUMENTS

| | | | |
|---|---|---|---|
| 2009/0224784 A1* | 9/2009 | Pagani | G01R 31/31905 324/762.02 |
| 2010/0237886 A1* | 9/2010 | Chou | G01R 31/31905 324/755.01 |
| 2012/0239339 A1* | 9/2012 | Kaneko | G01R 31/3025 702/122 |

\* cited by examiner

AMPLITUDE-MODULATING PROBE CARD AND ITS PROBE AND AMPLITUDE-MODULATING STRUCTURE

TECHNICAL FIELD

The present invention belongs to the technical field of probe cards, in particular to an amplitude-modulating probe card and its probe and amplitude-modulating structure.

BACKGROUND OF INVENTION

With the development of the semiconductor industry, more and more electronic devices are connected to semiconductor wafers. During the manufacturing process of semiconductor devices, the probe is contacted with the metal end of the semiconductor wafer to achieve temporary electrical connection, so that the electrical signal of the tester is transmitted to the semiconductor device through the probe and the tester detects the electronic device on the semiconductor wafer through the returned electrical signal.

The probe card is the link between the semiconductor wafer and the tester. Multiple probes are integrated on the probe card so that multiple probes can simultaneously contact multiple semiconductor devices on the semiconductor wafer to improve the detection efficiency.

During the production process of semiconductor devices, it is necessary to access a large number of circuit contacts in one or more devices multiple times, and move the probe card through a moving mechanism to make the probe contact with the contact. At the same time, in order to match multiple sets of contacts during the detection process, the probe card needs to be equipped with multiple probes, which are fixed by a holder that is a polyhedron that can rotate.

By setting one or more probe cards on each surface, or setting multiple movable platforms to move the probe cards, matching the probe cards with different contact sets can be achieved. The matching can be achieved by exchanging the probe cards, and a single probe card cannot be universal.

DISCLOSURE OF THE INVENTION

The present invention overcomes the shortcomings of the existing technologies mentioned above and provides an amplitude-modulating probe card and its probe and amplitude-modulating structure, which can adjust the detection amplitude of the probe and make a single probe card universal.

The technical solution of the present invention:

An amplitude-modulating probe card comprises a probe, a probe board, a circuit board, and an amplitude-modulating structure. The probe is fixed on the probe board, one end of the probe is connected to the circuit board, and the other end of the probe is clamped on the amplitude-modulating structure;

The probe comprises a probe head, a bent wire and a fixed wire. One end of the probe head is a circular probe used for detection, the middle of the probe head is clamped on the amplitude-modulating structure, the other end of the probe head is connected to one end of the bent wire, the middle of the bent wire is a bent elastic structure, the other end of the bent wire is connected to one end of the fixed wire, the middle of the fixed wire is fixed on the probe board, and the other end of the fixed wire is connected to the circuit board;

The amplitude-modulating structure comprises a fixed board, an amplitude-modulating board, an amplitude modulation connecting board, a reed, an amplitude modulation clamp board, an amplitude-modulating shaft, a main roller, and an eccentric roller. The fixed board is fixedly connected to the circuit board, and the upper end of the amplitude-modulating board is fixedly connected to the amplitude modulation connecting board, the lower end of the amplitude-modulating board vertically passes through the fixed board, circuit board, and probe board, and then is fixedly connected to the probe. A reed is set between the lower end of the amplitude modulation connecting board and the fixed board, and the side of the amplitude modulation connecting board is clamped by the amplitude modulation clamp plate, forming a sliding structure perpendicular to the fixed board. The amplitude-modulating shaft is arranged above the amplitude modulation connecting board, and a main roller and an eccentric roller are arranged on the amplitude-modulating shaft;

The multiple amplitude modulation connecting boards are arranged along the probes with one amplitude modulation connecting board arranged corresponding to the main roller, and with the remaining amplitude modulation connecting boards arranged corresponding to the eccentric roller;

The main roller is a circular roller arranged coaxially on the amplitude-modulating shaft, and the eccentric roller is provided with a virtual circle inside it, and the eccentric roller is provided with an eccentric notch that reaches the virtual circle on its edge. The eccentric notches of the multiple eccentric rollers increase sequentially along the direction from the main roller to the direction away from the main roller, and one side of the multiple eccentric notches is aligned.

Further, the probe board comprises a board body, a probe groove, a pressing plate groove, and a pressing plate. The board body is provided with several probe grooves to accommodate the probes, the pressing plate groove is arranged across the probe groove, the pressing plate is arranged in the pressing plate groove, and the pressing plate is fixedly connected to the board body.

Further, the bottom of the probe groove and the bottom of the pressing plate are provided with gaps for clamping the probes.

Further, it also comprises a speed reduction structure, which is arranged on the fixed board and connected to the amplitude-modulating shaft.

Further, the speed reduction structure comprises a reduction frame, a reduction gear and an adjusting wheel. The reduction frame is fixed on the fixed board, the reduction frame is provided with several reduction gears, the adjustment wheel is located on the outside of the reduction frame, and the adjusting wheel is connected with the amplitude-modulating shaft through the reduction gear.

Further, it also comprises a driving structure. The driving structure is arranged above the probe card, and the driving structure comprises a driving cylinder and a limiting cylinder, the driving cylinder is used to drive the amplitude modulation structure, several limiting cylinders are arranged sequentially on the stroke of the driving cylinder to limit the stroke of the driving cylinder.

Further, the driving structure is provided with a buffer structure.

The probe of an amplitude-modulating probe card comprises a probe head, a bent wire and a fixed wire. One end of the probe head is a circular probe used for detection, the middle of the probe head is clamped on the amplitude-modulating structure, the other end of the probe head is connected to one end of the bent wire, the middle of the bent wire is a bent elastic structure, the other end of the bent wire is connected to one end of the fixed wire, the middle of the fixed wire is fixed on the probe board, and the other end of the fixed wire is connected to the circuit board.

The amplitude-modulating structure of an amplitude-modulating probe card comprises a fixed board, an amplitude-modulating board, an amplitude modulation connecting board, a reed, an amplitude modulation clamp board, an amplitude-modulating shaft, a main roller, and an eccentric roller. The fixed board is fixedly connected to the circuit board, and the upper end of the amplitude-modulating board is fixedly connected to the amplitude modulation connecting board, the lower end of the amplitude-modulating board vertically passes through the fixed board, circuit board, and probe board, and then is fixedly connected to the probe. A reed is set between the lower end of the amplitude modulation connecting board and the fixed board, and the side of the amplitude modulation connecting board is clamped by the amplitude modulation clamp plate, forming a sliding structure perpendicular to the fixed board. The amplitude-modulating shaft is arranged above the amplitude modulation connecting board, and a main roller and an eccentric roller are arranged on the amplitude-modulating shaft.

A driving structure for the amplitude-modulating probe card. The driving structure is arranged above the probe card, and the driving structure comprises a driving cylinder and a limiting cylinder, the driving cylinder is used to drive the amplitude-modulating structure, and several limiting cylinders are arranged sequentially on the stroke of the driving cylinder to limit the stroke of the driving cylinder;

The driving structure further comprises: a driving cylinder slider, a driving cylinder slide, a limiting cylinder slider, a limiting cylinder slide, a fixing plate of the driving structure, a rack slider, a rack slide, a rack connecting block, a limiting contact block, and a driving rack. One end of the fixed plate of the driving structure is bent downwards, and the edge bending downwards is fixedly connected to the probe card. The driving cylinder is arranged longitudinally on the surface of the fixed plate of the driving structure, and the extended end of the driving cylinder is connected with the driving cylinder slider. The driving cylinder slider is slidably arranged in the driving cylinder slide, and the driving cylinder slider has the extended ends extending to both sides, with the extended end on one end extending to the outer side of the driving cylinder slide to form the rack connecting block and with the extended end on the other end extending to the outer side of the driving cylinder slide to form the limiting contact block. The rack connecting block is fixedly connected to the rack slider, and the rack slider is fixedly connected to the driving rack, and both sides of the rack slider are embedded in the rack slide. The driving rack is engaged with the adjusting wheel of the amplitude-modulating structure, and the multiple limiting cylinders are spaced along the driving cylinder slide. And the extended end of each limiting cylinder is connected to a limiting cylinder slider, and each limiting cylinder slider is slidably connected to a limiting cylinder slide. After the limiting cylinder is fully extended, the limiting cylinder slider connected to the limiting cylinder can slide onto the sliding path of the limiting contact block.

Further, it's applied on an amplitude-modulating probe card, and the amplitude-modulating probe card comprises a probe, a probe board, a circuit board, and an amplitude-modulating structure. The probe is fixed on the probe board, one end of the probe is connected to the circuit board, and the other end of the probe is clamped on the amplitude-modulating structure.

Further, the amplitude-modulating structure comprises a fixed board, an amplitude-modulating board, an amplitude modulation connecting board, a reed, an amplitude modulation clamp board, an amplitude-modulating shaft, a main roller, and an eccentric roller. The fixed board is fixedly connected to the circuit board, and the upper end of the amplitude-modulating board is fixedly connected to the amplitude modulation connecting board, the lower end of the amplitude-modulating board vertically passes through the fixed board, circuit board, and probe board, and then is fixedly connected to the probe. A reed is set between the lower end of the amplitude modulation connecting board and the fixed board, and the side of the amplitude modulation connecting board is clamped by the amplitude modulation clamp plate, forming a sliding structure perpendicular to the fixed board. The amplitude-modulating shaft is arranged above the amplitude modulation connecting board, and a main roller and an eccentric roller are arranged on the amplitude-modulating shaft; The multiple amplitude modulation connecting boards are arranged along the probes with one amplitude modulation connecting board arranged corresponding to the main roller, and with the remaining amplitude modulation connecting boards arranged corresponding to the eccentric roller;

The main roller is a circular roller arranged coaxially on the amplitude-modulating shaft, and the eccentric roller is provided with a virtual circle inside it, and the eccentric roller is provided with an eccentric notch that reaches the virtual circle on its edge. The eccentric notches of the multiple eccentric rollers increase sequentially along the direction from the main roller to the direction away from the main roller, and one side of the multiple eccentric notches is aligned.

Further, the number of limiting cylinders is the same and corresponds to the number of eccentric rollers on one side of the main roller, and after the driving cylinder extends to the limiting stroke of the limiting cylinder, the amplitude modulation connecting board below the corresponding eccentric roller of the limiting cylinder rotates out from the eccentric notch of the eccentric roller.

Further, the driving structure is also provided with a buffer structure.

A buffer structure for the amplitude-modulating probe card is arranged on the driving structure, and the driving structure comprises a driving cylinder, a limiting cylinder, a driving cylinder slider, and a limiting cylinder slider;

The buffer structure comprises a buffer support plate and a buffer pad, wherein the buffer support plate is provided with several buffer pads, and the driving cylinder and limiting cylinder are both arranged on the buffer pad;

The buffer structure further comprises: a vertical plate, a buffer cylinder, a piston block, an ejector pin of piston block, a guide rod, a slide cylinder of guide rod, a spring of slide cylinder, a push rod of slide cylinder, a lock of slide cylinder, and a spring of slide cylinder lock. The vertical plate is fixed on the buffer support plate, and one end of the vertical plate is fixedly connected to the upper end of the buffer cylinder. The buffer cylinder has a double cylinder structure, and the internal sliding of the buffer cylinder is equipped with the piston blocks spanning its internal double cylinder structure. The extended end of the limiting cylinder passes through the vertical plate and enters a cylinder of the buffer cylinder to be connected with the piston block. One side of the piston block is equipped with an ejector pin of piston block, and the lower end of the buffer cylinder is equipped with the lock of slide cylinder corresponding to the ejector pin of piston block. The spring of the slide cylinder lock is arranged between the lock of slide cylinder and the inner wall of the buffer cylinder. The upper end of the lock of slide cylinder is equipped with a first locking dog that matches the ejector pin of piston block, and the left end of the lock of slide cylinder is equipped with a second locking dog that extends to the sliding path of the slide cylinder of guide rod. The piston block is also equipped with a guide rod, which is sleeved with slide cylinder of guide rod, and a spring of slide cylinder is arranged between the guide rod and the slide cylinder of guide rod. The lower end of the slide cylinder of guide rod is equipped with a push rod of slide cylinder, which is connected to the limiting cylinder slider;

The buffer structure further comprises: a first rack, a first gear, a gear carrier, a gear shaft, a volute spiral spring, a second gear, and a second rack. The upper end of the first rack is connected with the extended end of the driving cylinder, and the lower end of the first rack is engaged with the first gear. The first gear is a hollow gear, and the first gear is rotatably arranged on the gear carrier. The first gear is internally equipped with a gear shaft coaxially, and the volute spiral spring is arranged between the first gear and the gear shaft. One end of the gear shaft extends out of the gear carrier and is connected with the second gear, the second gear is engaged with the second rack, and the lower end of the second rack is connected with the driving cylinder slider.

Further, a movable connection allowing radial movement is used the between the driving cylinder and the first rack, and between the limiting cylinder and the piston block.

Further, the extended end of the driving cylinder is fixedly connected to a connector of driving cylinder, and the first rack is provided with a driving cylinder connector slot corresponding to the driving cylinder connector, and the driving cylinder connector slot is a slot with an allowance for the movement of the driving cylinder connector.

Further, the extended end of the limiting cylinder is fixedly connected to a connector of limiting cylinder, and the piston block is provided with a limiting cylinder connector slot corresponding to the limiting cylinder connector, and the limiting cylinder connector slot is a slot with an allowance for the movement of the limiting cylinder connector.

Further, the driving structure further comprises a driving cylinder slide, a limiting cylinder slide, a fixing plate of the driving structure, a rack slider, a rack slide, a rack connecting block, a limiting contact block, and a driving rack.

Further, the amplitude-modulating probe card comprises a probe, a probe board, a circuit board, and an amplitude-modulating structure. The probe is fixed on the probe board, one end of the probe is connected to the circuit board, and the other end of the probe is clamped on the amplitude-modulating structure.

A probe card amplitude-modulating method includes the following steps:
Step a: Determine the amplitude modulation width: Define the number of probes corresponding to the main roller of the amplitude-modulating structure as the basic amplitude, and make the difference between the number of probes required for the chip to be detected and the basic amplitude to obtain the amplitude modulation width;
Step b: Determine the number of amplitude-modulating boards: From the main roller to the direction away from the main roller, add the number of probes on the amplitude-modulating board to obtain the adjusted width, until the adjusted width covers the amplitude modulation width. The number of amplitude-modulating boards participating in the addition is the number of amplitude-modulating boards;
Step c: Determine the angle of the amplitude-modulating shaft: By rotating the amplitude-modulating shaft, when the amplitude-modulating board farthest from the main roller is rotated out of the eccentric notch of its corresponding eccentric roller, the angle at which the eccentric roller rotates from its initial position is used as the angle of the amplitude-modulating shaft;
Step d: Amplitude modulation driving: Rotate the amplitude-modulating shaft, and the amplitude-modulating shaft drives the main roller and eccentric roller to rotate. The amplitude-modulating board corresponding to the main roller is fixed, and the probe on the amplitude-modulating board is located in the detection position. The amplitude-modulating board corresponding to the eccentric roller rotates out of the eccentric notch of the corresponding eccentric roller, and moves downward under the push of the eccentric roller;
Step e: Probe deformation: The amplitude-modulating board moves downward, driving the probe head of the probe to move downward. The fixed wire in the probe is fixed, and the bent wire connecting the probe head and the fixed wire undergoes elastic deformation. The probe moves downward from the ready position to the detection position, thereby increasing the basic amplitude of the probe card to the side to the amplitude modulation width.

Further, several probes are fixed on the amplitude-modulating board corresponding to the eccentric roller. When determining the number of amplitude-modulating boards, the number of probes corresponding to the amplitude-modulating board is added until the adjusted width is not less than the amplitude modulation width.

Further, when rotating the amplitude-modulating shaft, the adjusting wheel is used to drive the rotation of the amplitude-modulating shaft, while the speed reduction structure connected between the adjusting wheel and the amplitude-modulating shaft is used for speed reduction.

Further, an amplitude-modulating probe card is used for amplitude modulation, and the amplitude-modulating probe card comprises a probe, a probe board, a circuit board, and an amplitude-modulating structure. The probe is fixed on the probe board, one end of the probe is connected to the circuit board, and the other end of the probe is clamped on the amplitude-modulating structure.

Further, the probe comprises a probe head, a bent wire and a fixed wire. One end of the probe head is a circular probe used for detection, the middle of the probe head is clamped on the amplitude-modulating structure, the other end of the probe head is connected to one end of the bent wire, the middle of the bent wire is a bent elastic structure, the other end of the bent wire is connected to one end of the fixed wire, the middle of the fixed wire is fixed on the probe board, and the other end of the fixed wire is connected to the circuit board;

The amplitude-modulating structure comprises a fixed board, an amplitude-modulating board, an amplitude modulation connecting board, a reed, an amplitude modulation clamp board, an amplitude-modulating shaft, a main roller, and an eccentric roller. The fixed board is fixedly connected to the circuit board, and the upper end of the amplitude-modulating board is fixedly connected to the amplitude modulation connecting board, the lower end of the amplitude-modulating board vertically passes through the fixed board, circuit board, and probe board, and then is fixedly connected to the probe. A reed is set between the lower end of the amplitude modulation connecting board and the fixed board, and the side of the amplitude modulation connecting board is clamped by the amplitude modulation clamp plate, forming a sliding structure perpendicular to the fixed board.

The amplitude-modulating shaft is arranged above the amplitude modulation connecting board, and a main roller and an eccentric roller are arranged on the amplitude-modulating shaft;

The multiple amplitude modulation connecting boards are arranged along the probes with one amplitude modulation connecting board arranged corresponding to the main roller, and with the remaining amplitude modulation connecting boards arranged corresponding to the eccentric roller;

The main roller is a circular roller arranged coaxially on the amplitude-modulating shaft, and the eccentric roller is provided with a virtual circle inside it, and the eccentric roller is provided with an eccentric notch that reaches the virtual circle on its edge. The eccentric notches of the multiple eccentric rollers increase sequentially along the the direction from the main roller to the direction away from the main roller, and one side of the multiple eccentric notches is aligned.

The beneficial effects of the invention are as follows:
1. For the amplitude-modulating probe card of the present invention, the probe is equipped with a bent wire to make longitudinal elastic deformation for the probe, and the probe head is equipped with an amplitude-modulating board. The amplitude-modulating board is driven by an eccentric roller, which can achieve upward and downward movement of the amplitude-modulating board, thereby driving the probe to deform, causing the probe head of the probe to move from the detection position to the ready position, or from the ready position to the detection position, so that the number of probes in the detection position can be adjusted to enable to adjust the detection amplitude of a single probe card, making the probe card universal.
2. The driving structure of the amplitude-modulating probe card of the present invention comprises a driving cylinder for driving amplitude modulation and a limiting cylinder for limiting. The limiting cylinder is set within the stroke of the extended end of the driving cylinder, so that the driving cylinder has multiple gears when driving amplitude modulation, with each gear corresponding to the eccentric roller of the amplitude-modulating probe card. While achieving automatic amplitude modulation, the probe after amplitude modulation can be fixed without generating electromagnetic interference.
3. The buffer structure of the amplitude-modulating probe card of the present invention isolates the driving cylinder and limiting cylinder from the probe card through a buffer support plate and buffer pad to reduce vibration. At the same time, a buffer structure is set between the driving cylinder and the driving slider, and between the limiting cylinder and the limiting slider to reduce vibration generated when the cylinder extends.
4. The probe card amplitude-modulating method of the present invention includes the steps of determining the amplitude modulation width, determining the number of amplitude-modulating boards, determining the angle of the amplitude-modulating shaft, amplitude modulation driving, and probe deformation, enabling the probe card to adjust the number of probes involved in detection based on the number of contacts to be detected, thereby achieving amplitude modulation of the probe card, enabling the adjustment of the detection amplitude of a single probe card to make the probe card universal.

In the figures: 1 including the probe; 2 Probe board; 3 Circuit board; 4 Amplitude-modulating structure; 5 Speed reduction structure; 6 Driving structure; 7 Buffer structure; 1-1 Probe head; 1-2 Bent wire; 1-3 Fixed wires; 2-1 Board body; 2-2 Probe slot; 2-3 Pressing plate groove; 2-4 Pressing plate; 4-1 Fixed board; 4-2 Amplitude-modulating board; 4-3 Amplitude modulation connecting board; 4-4 Reed; 4-5 Amplitude modulation clamp board; 4-6 Amplitude-modulating shaft; 4-7 Main roller; 4-8 Eccentric roller; 5-1 Reduction frame; 5-2 Reduction gear; 5-3 Adjusting wheel; 6-1 Driving cylinder; 6-2 Limiting cylinder; 6-3 Driving cylinder slider; 6-4 Driving cylinder slide; 6-5 Limiting cylinder slider; 6-6 Limiting cylinder slide; 6-7 Fixing plate of the driving structure; 6-8 Rack slider; 6-9 Rack slide; 6-10 Rack connecting block; 6-11 Limiting contact block; 6-12 Driving rack; 7-1 Buffer support plate; 7-2 Buffer pad; 7-3 Vertical plate; 7-4 Buffer cylinder; 7-5 Piston block; 7-6 Ejector pin of piston block; 7-7 Guide rod; 7-8 Slide cylinder of guide rod; 7-9 Spring of slide cylinder; 7-10 Push rod of slide cylinder; 7-11 Lock of slide cylinder; 7-12 Spring of slide cylinder lock; 7-13 First rack; 7-14 First gear; 7-15 Gear carrier; 7-16 Gear shaft; 7-17 Volute spiral spring; 7-18 Second gear; 7-19 Second rack.

SPECIFIC EMBODIMENT

The present invention will be explained in detail with the attached figures:

Embodiment 1

This embodiment is an embodiment of an amplitude-modulating probe card.

Figure 1:
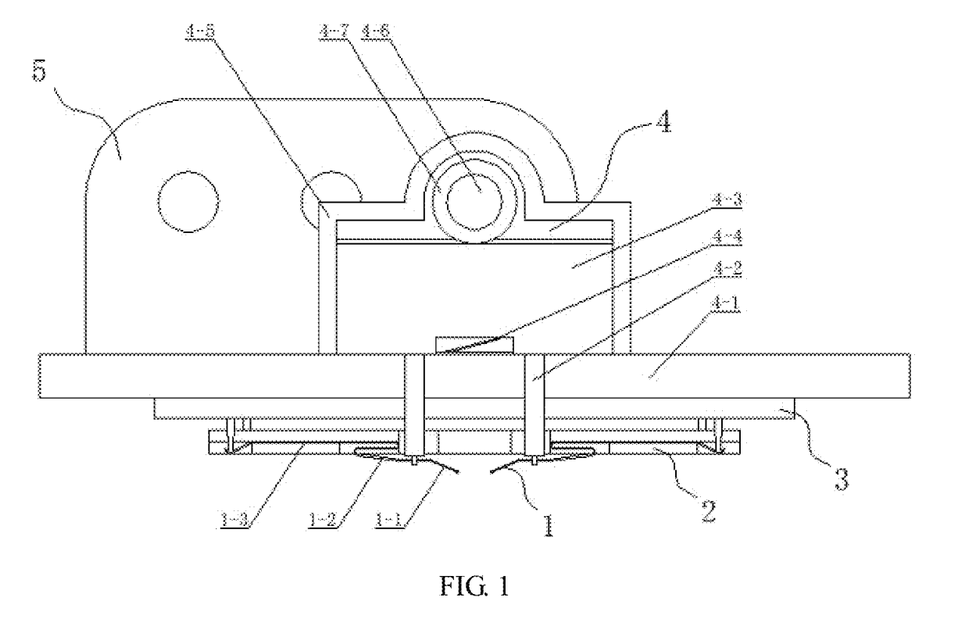
FIG. 1 is a schematic view of the overall structure of an amplitude-modulating probe card.

As shown in FIG. 1, an amplitude-modulating probe card comprises a probe 1, a probe board 2, a circuit board 3, and amplitude-modulating structure 4. The probe 1 is fixed on the probe board 2, one end of the probe 1 is connected to the circuit board 3, and the other end of the probe 1 is clamped on the amplitude-modulating structure 4. The end of the probe 1 contacts the contact of the semiconductor device, and the electrical signal is transmitted to the circuit board 3 through the probe 1, and then transmitted to the tester for detection by the circuit board 3. The amplitude-modulating structure 4 is connected to the detection end of probe 1. When the height of probe 1 is adjusted by the amplitude-modulating structure 4, different numbers of probes 1 can be located at lower detection positions and participate in the detection, while the remaining probes 1 are in higher ready positions and do not participate in the detection. Due to the adjustment of the number of probes 1 involved in detection through the amplitude-modulating structure 4, the detection amplitude of the overall probe can be changed, thereby achieving the amplitude modulation of the probe card, making a single probe card universal.

As shown in FIG. 1, the probe 1 comprises a probe head 1-1, a bent wire 1-2, and a fixed wire 1-3. One end of the probe head 1-1 is a circular probe used for detection, the middle of the probe head 1-1 is clamped on the amplitude-modulating structure 4, and the other end of the probe head 1-1 is connected to one end of the bent wire 2. The embodiment shows a V-shaped probe head 1-1, but it should be understood that the probe head 1-1 can be a right angle or circular arc shape, so that the front end of the probe head 1-1 is in the lower position for easy contact with the contact point. The rear end of probe head 1-1 is fixed on the amplitude-modulating structure 4, so that when the rear end of probe head 1-1 moves up and down with the amplitude-modulating structure 4, it can drive the front end of probe head 1-1 to move up and down to change the height of the front end of probe head 1-1.

The middle of the bent wire 1-2 is a bent elastic structure, the other end of the bent wire 1-2 is connected to one end of the fixed wire 1-3, and the rear end of the probe head 1-1 is connected to the bent wire 1-2. The elastic leg shows a S-shaped bent wire, but it should be understood that the bent wire 1-2 can be arranged in a spiral or folded line shape, so that the bent wire 1-2 has the ability to deform elastically in the height direction, maintain electrical connection when the probe head 1-1 moves up and down, and have the ability of repeated elastic deformation.

The middle of fixed wires 1-3 is fixed on the probe board 2, and the other end of fixed wires 1-3 is connected to circuit board 3.

Figure 2:
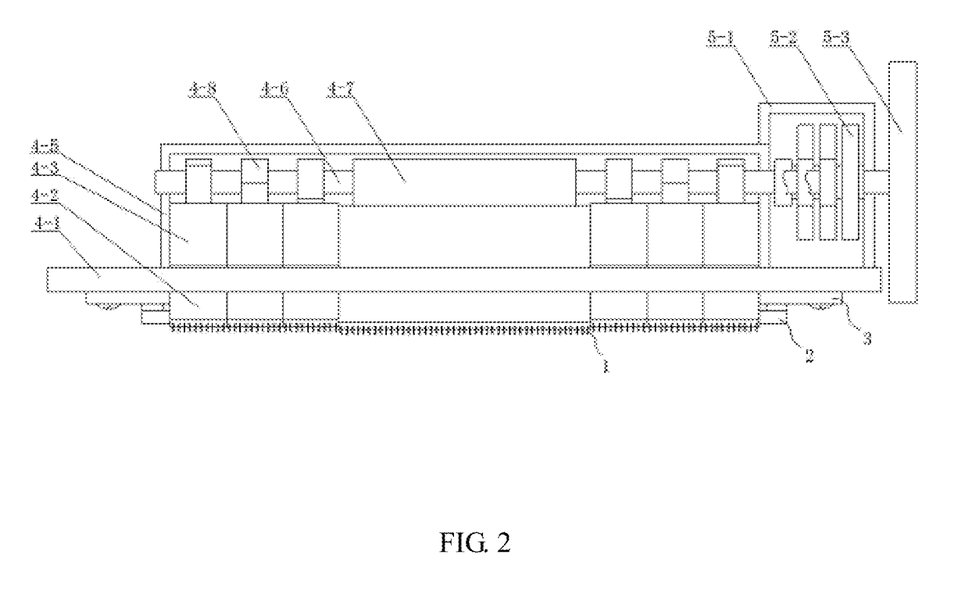
FIG. 2 is a schematic view of the lateral structure of an amplitude-modulating probe card.

As shown in FIGS. 1 and 2, the amplitude-modulating structure 4 comprises a fixed board 4-1, an amplitude-modulating board 4-2, an amplitude modulation connecting board 4-3, a reed 4-4, an amplitude modulation clamp board 4-5, an amplitude-modulating shaft 4-6, a main roller 4-7, and an eccentric roller 4-8. The fixed board 4-1 is fixedly connected to the circuit board 3, and the upper end of the amplitude-modulating board 4-2 is fixedly connected to the amplitude modulation connecting board 4-3, the lower end of the amplitude-modulating board 4-2 vertically passes through the fixed board 4-1, circuit board 3, and probe board 2, and then is fixedly connected to the probe 1. A reed 4-4 is set between the lower end of the amplitude modulation connecting board 4-3 and the fixed board 4-1, and the side of the amplitude modulation connecting board 4-3 is clamped by the amplitude modulation clamp plate 4-5, forming a sliding structure perpendicular to the fixed board 4-1. The amplitude-modulating shaft 4-6 is arranged above the amplitude modulation connecting board 4-5, and a main roller 4-7 and an eccentric roller 4-8 are arranged on the amplitude-modulating shaft 4-6; the amplitude modulation clamp plate 4-5 is connected to the amplitude modulation connecting plate 4-3 through a longitudinal slide structure to clamp and limit the amplitude modulation connecting plate 4-3 to enable the amplitude modulation connecting plate 4-3 to slide longitudinally, thereby enabling the amplitude-modulating board 4-2 to slide longitudinally and driving the probe head 1-1 to move. The reed 4-4 set between the amplitude modulation connecting plate 4-3 and the fixed board 4-1 applies an upward push to the amplitude modulation connecting plate 4-3, keeping the amplitude modulation connecting plate 4-3 in the upper position, thereby causing the probe head 1-1 connected to the amplitude-modulating board 4-2 to be in the upper position to be detected. The amplitude-modulating shaft 4-6 is rotatably connected to the fixed board 4-1, and the main roller 4-7 and eccentric roller 4-8 on the amplitude-modulating shaft 4-6 are in contact with the upper end of the corresponding amplitude modulation connecting plate 4-3. By setting the eccentricity of the eccentric roller 4-8, it can be achieved that when the amplitude-modulating shaft 4-6 is rotated, the eccentric roller 4-8 push the amplitude modulation connecting plate 4-3 downward, causing the amplitude-modulating board 4-2 to drive the probe head 1-1 to move downward to the lower detection position.

As shown in FIG. 2, the multiple amplitude modulation connecting boards 4-3 are arranged along the probe 1 with one amplitude modulation connecting board 4-3 arranged corresponding to the main roller 4-7, and with the remaining amplitude modulation connecting boards 4-3 arranged corresponding to the eccentric roller 4-8; the embodiment shows the arrangement of three eccentric rollers 4-8 on both sides of the main roller 4-7, and each amplitude modulation connecting board 4-3 is fixed with the multiple probes 1. It should be understood that the main roller 4-7 can use the arrangement of eccentric rollers 4-8 on one side, and the main roller 4-7 can be provided with multiple eccentric rollers 4-8 on the lateral face and the amplitude modulating board 4-2 corresponding to each eccentric roller 4-8 can be fixed with a single or multiple probe heads 1-1.

Figure 3:
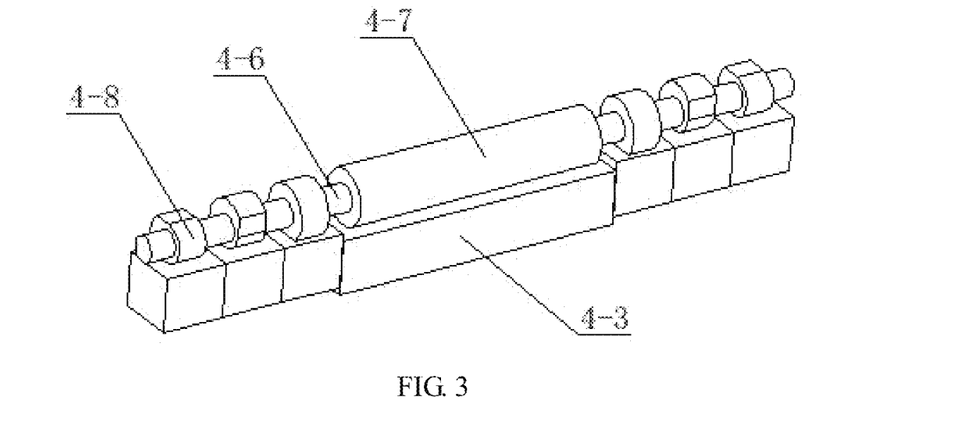
FIG. 3 is a schematic view of the amplitude-modulating shaft in FIG. 1.

As shown in FIG. 3, the main roller 4-7 is a circular roller arranged coaxially on the amplitude-modulating shaft 4-6, and the eccentric roller 4-8 is arranged with an eccentric notch. When the main roller 4-7 rotate, the height of the amplitude modulation connecting plate 4-3 corresponding to the main roller 4-7 remains unchanged, so that the corresponding probe head 1-1 on the amplitude modulating board 4-2 corresponding to the main roller 4-7 is always kept in the lower detection position as the basic amplitude of the probe card; before the rotation of the main roller 4-7, the amplitude modulation connecting board 4-3 corresponding to the eccentric roller 4-8 is embedded into the eccentric notch of the eccentric roller 4-8, and the amplitude modulation connecting board 4-3 fit in the eccentric notch makes the corresponding amplitude modulating board 4-2 drive the corresponding probe head 1-1 to be in an upper position to be detected. When the main roller 4-7 rotates, the eccentric roller 4-7 rotates, and the amplitude modulation connecting board 4-3 located in the eccentric notch rotates out of the eccentric notch and the eccentric roller 4-8 pushes the corresponding amplitude modulation connecting board 4-3 downward to drive the amplitude modulating board 4-2 corresponding to the amplitude modulation connecting plate 4-3 to drive the probe head 1-1 corresponding to the amplitude modulating board 4-2 to move downwards from the position to be detected to the detection position.

Figure 4:
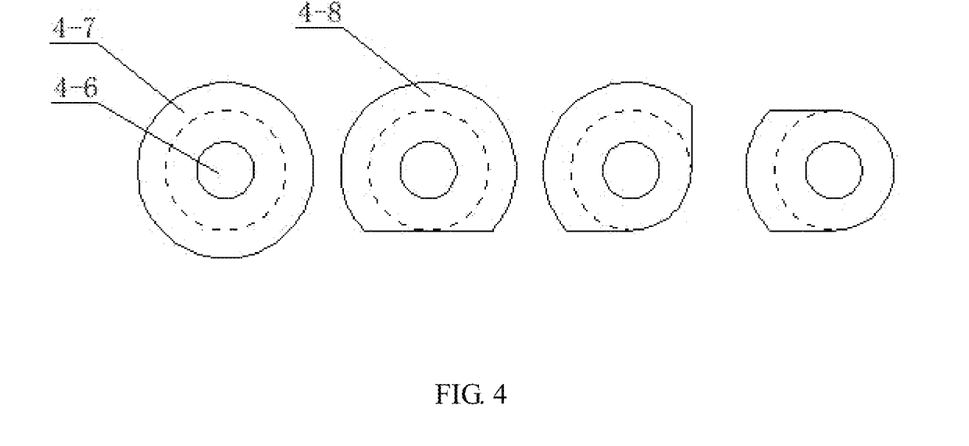
FIG. 4 is a schematic view of the eccentric roller in FIG. 3.

As shown in FIGS. 3 and 4, the eccentric rollers 4-8 are internally equipped with a virtual circle, and the eccentric roller 4-8 is provided with an eccentric notch that reaches the virtual circle on its edge. The eccentric notches of the multiple eccentric rollers 4-8 increase sequentially along the direction from the main roller 4-7 to the direction away from the main roller 4-7, and one side of the multiple eccentric notches is aligned. As shown in FIG. 4, the eccentric notches of eccentric rollers 4-8 increase sequentially along the the direction from the main roller 4-7 to the direction away from the main roller 4-7, and multiple eccentric notches have the same starting point in the circumferential direction. This enables the amplitude modulation connecting boards 4-3 below the multiple eccentric rollers to rotate out of the eccentric notch sequentially along the the direction from the main roller 4-7 to the direction away from the main roller 4-7 when the amplitude-modulating shaft 4-6 rotates, making the amplitude modulation process continuous.

Figure 5:
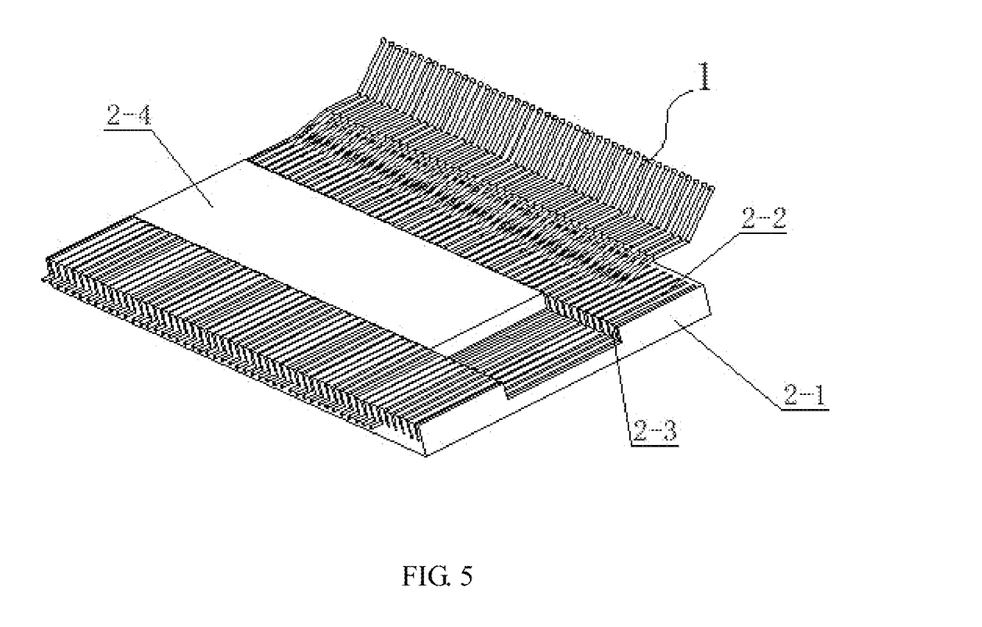
FIG. 5 is a schematic view of the probe board.

Specifically, as shown in FIG. 5, the probe board 2 comprises a board body 2-1, a probe groove 2-2, a pressing plate groove 2-3, and a pressing plate 2-4. The board body 2-1 is provided with several probe grooves 2-2 to accommodate the probes 1, the pressing plate groove 2-3 is arranged across the probe groove 2-2, the pressing plate 2-4 is arranged in the pressing plate groove 2-3, and the pressing plate 2-4 is fixedly connected to the board body 2-1. The board body 2-1 is arranged with multiple probe grooves 2-2 for installing probes 1, and the pressing plate groove 2-3 separates the probe groove 2-2 into two parts. The front part is used to accommodate the bent wire 1-2 of probe 1, and the front part is arranged to expose the lower end of the bent wire 1-2 from the probe groove 2-2 and the rear part is used to connect with the circuit board 3. The probe 1 located in the pressing plate groove 2-3 is pressed and fixed by the pressing plate 2-4.

Specifically, the bottom of the probe groove 2-2 and the bottom of the pressing plate 2-4 are provided with gaps for clamping the probes 1.

Specifically, it also comprises a speed reduction structure 5, and the speed reduction structure 5 is arranged on the fixed board 4-1 and connected to the amplitude-modulating shaft 4-6.

Specifically, the speed reduction structure 5 comprises a reduction frame 5-1, a reduction gear 5-2 and an adjusting wheel 5-3. The reduction frame 5-1 is fixed on the fixed board 4-1, the reduction frame 5-1 is provided with several reduction gears 5-2, the adjustment wheel 5-3 is located on the outside of the reduction frame 5-1, and the adjusting wheel 5-3 is connected with the amplitude-modulating shaft 4-6 through the reduction gear 5-2. When the adjustment wheel 5-3 is rotated, it is decelerated by the reduction gear 5-2 to drive the rotation of amplitude-modulating shaft 4-6 to facilitate the control of the angle of rotation of amplitude-modulating shaft 4-6.

Specifically, it also comprises a driving structure 6. The driving structure 6 is arranged above the probe card, and the driving structure 6 comprises a driving cylinder 6-1 and a limiting cylinder 6-2, the driving cylinder 6-1 is used to drive the amplitude-modulating structure 4, several limiting cylinders 6-2 are arranged sequentially on the stroke of the driving cylinder 6-1 to limit the stroke of the driving cylinder 6-1. By cylinder driving, electromagnetic interference is avoided. Multiple limiting cylinders 6-2 are set on the stroke of driving cylinder 6-1, and the driving cylinder 6-1 has multiple gears on the stroke corresponding to the gears formed by multiple eccentric rollers 4-8, which facilitates the control of driving.

Specifically, the driving structure 6 is also provided with a buffer structure 7.

Embodiment 2

This embodiment is an embodiment of an probe of an amplitude-modulating probe card.

The embodiment discloses a probe of an amplitude-modulating probe card, and the probe is applied to an amplitude-modulating probe card disclosed in embodiment 1.

As shown in FIG. 1, the probe 1 comprises a probe head 1-1, a bent wire 1-2, and a fixed wire 1-3. One end of the probe head 1-1 is a circular probe used for detection, the middle of the probe head 1-1 is clamped on the amplitude-modulating structure 4, and the other end of the probe head 1-1 is connected to one end of the bent wire 2. The embodiment shows a V-shaped probe head 1-1, but it should be understood that the probe head 1-1 can be a right angle or circular arc shape, so that the front end of the probe head 1-1 is in the lower position for easy contact with the contact point. The rear end of probe head 1-1 is fixed on the amplitude-modulating structure 4, so that when the rear end of probe head 1-1 moves up and down with the amplitude-modulating structure 4, it can drive the front end of probe head 1-1 to move up and down to change the height of the front end of probe head 1-1.

The middle of the bent wire 1-2 is a bent elastic structure, the other end of the bent wire 1-2 is connected to one end of the fixed wire 1-3, and the rear end of the probe head 1-1 is connected to the bent wire 1-2. The elastic leg shows a S-shaped bent wire, but it should be understood that the bent wire 1-2 can be arranged in a spiral or folded line shape, so that the bent wire 1-2 has the ability to deform elastically in the height direction, maintain electrical connection when the probe head 1-1 moves up and down, and have the ability of repeated elastic deformation.

The middle of fixed wires 1-3 is fixed on the probe board 2, and the other end of fixed wires 1-3 is connected to circuit board 3.

Embodiment 3

This embodiment is an embodiment of an amplitude-modulating structure of an amplitude-modulating probe card.

The embodiment discloses an amplitude-modulating structure of an amplitude-modulating probe card, and it is applied to an amplitude-modulating probe card disclosed in embodiment 1.

As shown in FIGS. 1 and 2, the amplitude-modulating structure 4 comprises a fixed board 4-1, an amplitude-modulating board 4-2, an amplitude modulation connecting board 4-3, a reed 4-4, an amplitude modulation clamp board 4-5, an amplitude-modulating shaft 4-6, a main roller 4-7, and an eccentric roller 4-8. The fixed board 4-1 is fixedly connected to the circuit board 3, and the upper end of the amplitude-modulating board 4-2 is fixedly connected to the amplitude modulation connecting board 4-3, the lower end of the amplitude-modulating board 4-2 vertically passes through the fixed board 4-1, circuit board 3, and probe board 2, and then is fixedly connected to the probe 1. A reed 4-4 is set between the lower end of the amplitude modulation connecting board 4-3 and the fixed board 4-1, and the side of the amplitude modulation connecting board 4-3 is clamped by the amplitude modulation clamp plate 4-5, forming a sliding structure perpendicular to the fixed board 4-1. The amplitude-modulating shaft 4-6 is arranged above the amplitude modulation connecting board 4-5, and a main roller 4-7 and an eccentric roller 4-8 are arranged on the amplitude-modulating shaft 4-6; the amplitude modulation clamp plate 4-5 is connected to the amplitude modulation connecting plate 4-3 through a longitudinal slide structure to clamp and limit the amplitude modulation connecting plate 4-3 to enable the amplitude modulation connecting plate 4-3 to slide longitudinally, thereby enabling the amplitude-modulating board 4-2 to slide longitudinally and driving the probe head 1-1 to move. The reed 4-4 set between the amplitude modulation connecting plate 4-3 and the fixed board 4-1 applies an upward push to the amplitude modulation connecting plate 4-3, keeping the amplitude modulation connecting plate 4-3 in the upper position, thereby causing the probe head 1-1 connected to the amplitude-modulating board 4-2 to be in the upper position to be detected. The amplitude-modulating shaft 4-6 is rotatably connected to the fixed board 4-1, and the main roller 4-7 and eccentric roller 4-8 on the amplitude-modulating shaft 4-6 are in contact with the upper end of the corresponding amplitude modulation connecting plate 4-3. By setting the eccentricity of the eccentric roller 4-8, it can be achieved that when the amplitude-modulating shaft 4-6 is rotated, the eccentric roller 4-8 push the amplitude modulation connecting plate 4-3 downward, causing the amplitude-modulating board 4-2 to drive the probe head 1-1 to move downward to the lower detection position.

As shown in FIG. 2, the multiple amplitude modulation connecting boards 4-3 are arranged along the probe 1 with one amplitude modulation connecting board 4-3 arranged corresponding to the main roller 4-7, and with the remaining amplitude modulation connecting boards 4-3 arranged corresponding to the eccentric roller 4-8; the embodiment shows the arrangement of three eccentric rollers 4-8 on both sides of the main roller 4-7, and each amplitude modulation connecting board 4-3 is fixed with the multiple probes 1. It should be understood that the main roller 4-7 can use the arrangement of eccentric rollers 4-8 on one side, and the main roller 4-7 can be provided with multiple eccentric rollers 4-8 on the lateral face and the amplitude modulating board 4-2 corresponding to each eccentric roller 4-8 can be fixed with a single or multiple probe heads 1-1.

As shown in FIG. 3, the main roller 4-7 is a circular roller arranged coaxially on the amplitude-modulating shaft 4-6, and the eccentric roller 4-8 is arranged with an eccentric notch. When the main roller 4-7 rotate, the height of the amplitude modulation connecting plate 4-3 corresponding to the main roller 4-7 remains unchanged, so that the corresponding probe head 1-1 on the amplitude modulating board 4-2 corresponding to the main roller 4-7 is always kept in the lower detection position as the basic amplitude of the probe card; before the rotation of the main roller 4-7, the amplitude modulation connecting board 4-3 corresponding to the eccentric roller 4-8 is embedded into the eccentric notch of the eccentric roller 4-8, and the amplitude modulation connecting board 4-3 fit in the eccentric notch makes the corresponding amplitude modulating board 4-2 drive the corresponding probe head 1-1 to be in an upper position to be detected. When the main roller 4-7 rotates, the eccentric roller 4-7 rotates, and the amplitude modulation connecting board 4-3 located in the eccentric notch rotates out of the eccentric notch and the eccentric roller 4-8 pushes the corresponding amplitude modulation connecting board 4-3 downward to drive the amplitude modulating board 4-2 corresponding to the amplitude modulation connecting plate 4-3 to drive the probe head 1-1 corresponding to the amplitude modulating board 4-2 to move downwards from the position to be detected to the detection position.

As shown in FIGS. 3 and 4, the eccentric rollers 4-8 are internally equipped with a virtual circle, and the eccentric roller 4-8 is provided with an eccentric notch that reaches the virtual circle on its edge. The eccentric notches of the multiple eccentric rollers 4-8 increase sequentially along the direction from the main roller 4-7 to the direction away from the main roller 4-7, and one side of the multiple eccentric notches is aligned. As shown in FIG. 4, the eccentric notches of eccentric rollers 4-8 increase sequentially along the the direction from the main roller 4-7 to the direction away from the main roller 4-7, and multiple eccentric notches have the same starting point in the circumferential direction. This enables the amplitude modulation connecting boards 4-3 below the multiple eccentric rollers to rotate out of the eccentric notch sequentially along the the direction from the main roller 4-7 to the direction away from the main roller 4-7 when the amplitude-modulating shaft 4-6 rotates, making the amplitude modulation process continuous.

Embodiment 4

This embodiment is an embodiment of a driving structure of an amplitude-modulating probe card.

The embodiment discloses a driving structure of an amplitude-modulating probe card, and the driving structure is applied to an amplitude-modulating probe card disclosed in embodiment 1.

Figure 6:
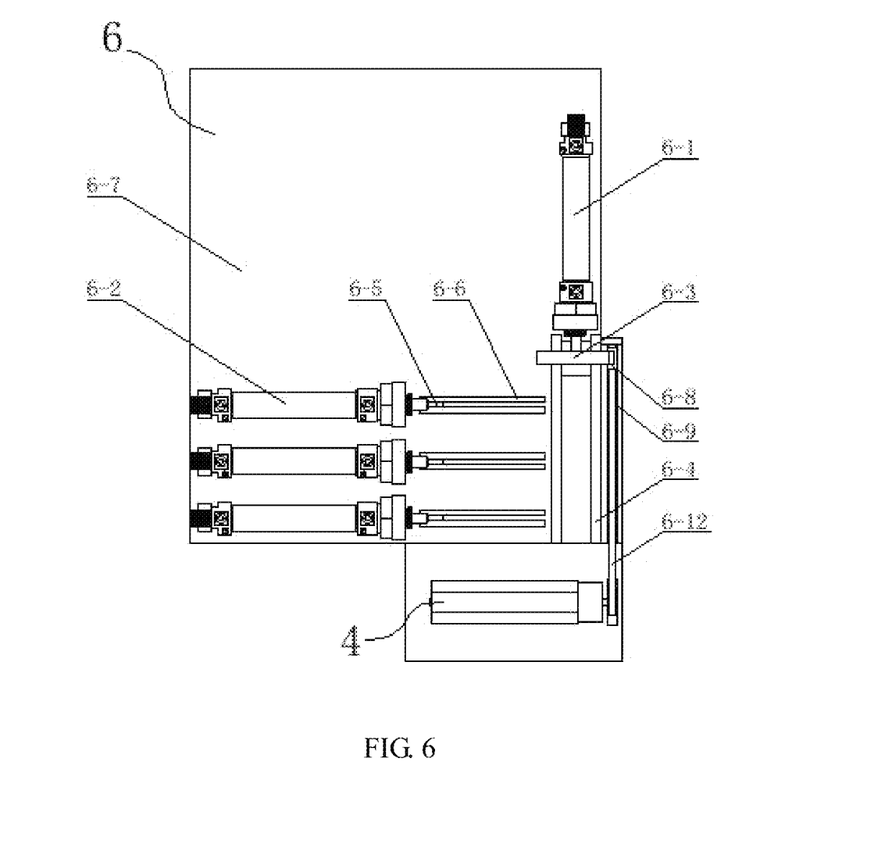
FIG. 6 is a schematic view of the driving structure.
Figure 7:
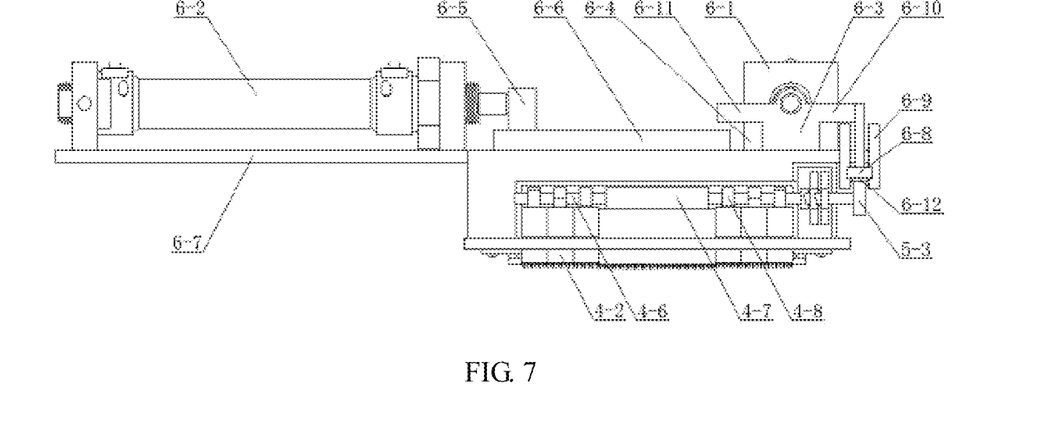
FIG. 7 is a lateral schematic view of FIG. 6.

As shown in FIGS. 6 and 7, the driving structure 6 is arranged above the probe card, and the driving structure 6 comprises a driving cylinder 6-1 and a limiting cylinder 6-2, the driving cylinder 6-1 is used to drive the amplitude-modulating structure 4, several limiting cylinders 6-2 are arranged sequentially on the stroke of the driving cylinder 6-1 to limit the stroke of the driving cylinder 6-1.

In this embodiment, the stroke of the driving cylinder 6-1 corresponds to the rotation angle of the amplitude-modulating shaft 4-6 of the amplitude-modulating probe card. As shown in FIGS. 3 and 4, the radian values of the amplitude-modulating shaft 4-6 are separated by the number of main rollers 4-7 plus eccentric rollers 4-8 on one side. The separated radian is assigned to an eccentric roller 4-8, so that when the radian of the amplitude-modulating shaft 4-6 rotates across domain, the amplitude-modulating board 4-2 in the eccentric notch corresponding to the eccentric roller 4-8 moves downwards, causing the corresponding probe to move downwards to the detection position, forming a gear corresponding to the rotation angle of the amplitude-modulating shaft 4-6. This gear is obtained by setting the limiting position of the limiting cylinder 6-2 to the driving cylinder 6-1.

The driving structure further comprises: a driving cylinder slider 6-3, a driving cylinder slide 6-4, a limiting cylinder slider 6-5, a limiting cylinder slide 6-6, a fixing plate of the driving structure 6-7, a rack slider 6-8, a rack slide 6-9, a rack connecting block 6-10, a limiting contact block 6-11, and a driving rack 6-12. One end of the fixed plate of the driving structure 6-7 is bent downwards, and the edge bending downwards is fixedly connected to the probe card. The driving cylinder 6-1 is arranged longitudinally on the surface of the fixed plate of the driving structure 6-7, and the extended end of the driving cylinder 6-1 is connected with the driving cylinder slider 6-3. The driving cylinder slider 6-3 is slidably arranged in the driving cylinder slide 6-4, and the driving cylinder slider 6-3 has the extended ends extending to both sides, with the extended end on one end extending to the outer side of the driving cylinder slide 6-4 to form the rack connecting block 6-10 and with the extended end on the other end extending to the outer side of the driving cylinder slide 6-4 to form the limiting contact block 6-11.

As shown in FIG. 6, the driving cylinder 6-2 push the limiting cylinder sliders 6-5 at different strokes to the right end of the limiting cylinder slide 6-6. When the driving cylinder 6-1 pushes the driving cylinder slider 6-3 to move downwards, the driving cylinder slider 6-3 slides inside the driving cylinder slide 6-4 and drives the fine contact block 6-11 on the side to move downwards until the limiting contact block 6-11 contacts the limiting cylinder slider 6-5, to limit the stroke of the driving cylinder 6-1 and achieve the limit of the rotation angle of the amplitude-modulating shaft 4-6, thereby controlling the number of probes 1 located in the detection position.

The rack connecting block 6-10 is fixedly connected with the rack slider 6-8, and the rack slider 6-8 is fixedly connected with the driving rack 6-12, and both sides of the rack slider 6-8 are embedded in the rack slide 6-10, and the driving rack 6-12 is engaged with the adjusting wheel 5-3 of the amplitude-modulating structure 4. Multiple limiting cylinders 6-2 are spaced along the driving cylinder slide 6-4, and the extended end of each limiting cylinder 6-2 is connected to a limiting cylinder slider 6-5. Each limit cylinder slider 6-5 is slidably connected to a limiting cylinder slide 6-6. After the limiting cylinders 6-2 fully extend, the limiting cylinder slider 6-5 connected to the limiting cylinder 6-2 can slide onto the sliding path of the limiting contact block 6-11.

The extended end of the driving cylinder 6-1 pushes the driving cylinder slider 6-3 to move, driving the driving rack 6-12 to move, causing the adjusting wheel 5-3 engaged with the driving rack 6-12 to rotate, thereby driving the amplitude-modulating shaft 4-6 to rotate.

While achieving automatic amplitude modulation with the amplitude-modulating probe card, electromagnetic interference is avoided. The amplitude-modulating structure has multiple gears that can correspond to the gears formed by the amplitude-modulating structure 4.

Specifically, it's applied on an amplitude-modulating probe card, and the amplitude-modulating probe card comprises a probe 1, a probe board 2, a circuit board 3, and an amplitude-modulating structure 4. The probe 1 is fixed on the probe board 2, one end of the probe 1 is connected to the circuit board 3, and the other end of the probe 1 is clamped on the amplitude-modulating structure 4.

Specifically, the amplitude-modulating structure 4 comprises a fixed board 4-1, an amplitude-modulating board 4-2, an amplitude modulation connecting board 4-3, a reed 4-4, an amplitude modulation clamp board 4-5, an amplitude-modulating shaft 4-6, a main roller 4-7, and an eccentric roller 4-8. The fixed board 4-1 is fixedly connected to the circuit board 3, and the upper end of the amplitude-modulating board 4-2 is fixedly connected to the amplitude modulation connecting board 4-3, the lower end of the amplitude-modulating board 4-2 vertically passes through the fixed board 4-1, circuit board 3, and probe board 2, and then is fixedly connected to the probe 1. A reed 4-4 is set between the lower end of the amplitude modulation connecting board 4-3 and the fixed board 4-1, and the side of the amplitude modulation connecting board 4-3 is clamped by the amplitude modulation clamp plate 4-5, forming a sliding structure perpendicular to the fixed board 4-1. The amplitude-modulating shaft 4-6 is arranged above the amplitude modulation connecting board 4-3, and a main roller 4-7 and an eccentric roller 4-8 are arranged on the amplitude-modulating shaft 4-6;

The multiple amplitude modulation connecting boards 4-3 are arranged along the probes 1 with one amplitude modulation connecting board 4-3 arranged corresponding to the main roller 4-7, and with the remaining amplitude modulation connecting boards 4-3 arranged corresponding to the eccentric roller 4-8;

The main roller 4-7 is a circular roller arranged coaxially on the amplitude-modulating shaft 4-6, and the eccentric roller 4-8 is provided with a virtual circle inside it, and the eccentric roller 4-8 is provided with an eccentric notch that reaches the virtual circle on its edge. The eccentric notches of the multiple eccentric rollers 4-8 increase sequentially along the direction from the main roller 4-7 to the direction away from the main roller 4-7, and one side of the multiple eccentric notches is aligned.

Specifically, the number of limiting cylinders 6-2 is the same and corresponds to the number of eccentric rollers 4-8 on one side of the main roller 4-7, and after the driving cylinder 6-1 extends to the limiting stroke of the limiting cylinder 6-2, the amplitude modulation connecting board 4-3 below the corresponding eccentric roller 4-8 of the limiting cylinder 6-2 rotates out from the eccentric notch of the eccentric roller 4-8.

Specifically, it is characterized in that the driving structure 6 is also provided with a buffer structure 7.

Embodiment 5

This embodiment is an embodiment of a buffer structure of an amplitude-modulating probe card.

The buffer structure of an amplitude-modulating probe card disclosed in this embodiment is applied to the driving structure of the amplitude-modulating probe card disclosed in embodiment 4 to reduce the vibration generated by the driving structure.

Figure 8:
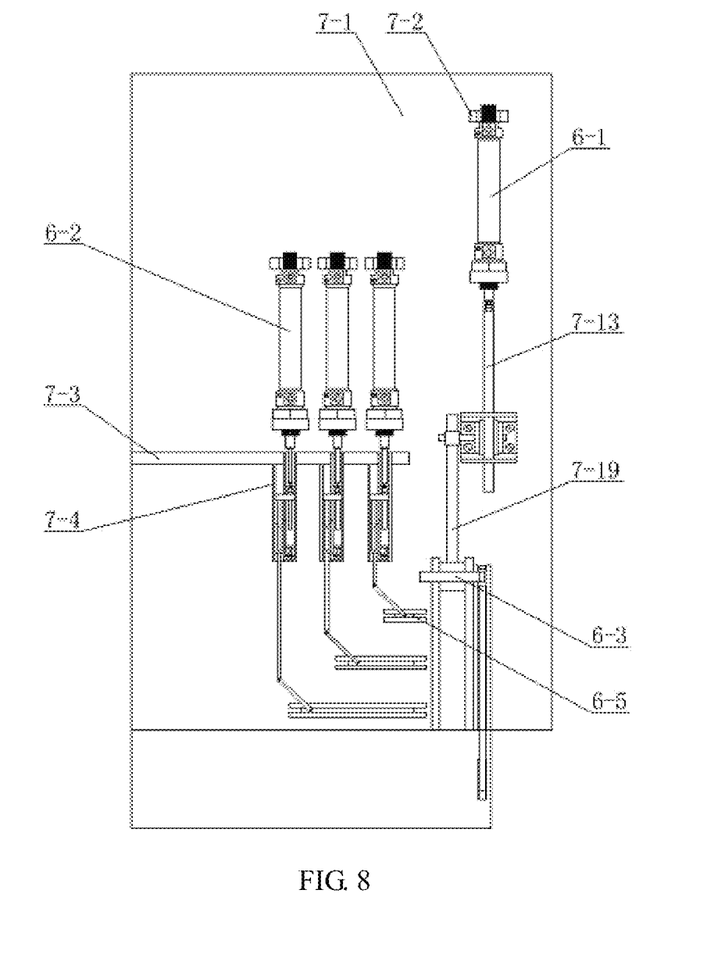
FIG. 8 is a schematic view of the buffer structure.

As shown in FIG. 8, it is arranged on the driving structure 6, and the driving structure 6 comprises a driving cylinder 6-1, a limiting cylinder 6-2, a driving cylinder slider 6-3, and limiting cylinder slider 6-5. The buffer structure 7 is connected in series between the cylinder and the slider to disconnect the vibration of the cylinder from the slider. After filtering out the vibration, it does not affect the pushing of the slider.

The buffer structure 7 comprises a buffer support plate 7-1 and a buffer pad 7-2, and the buffer support plate 7-1 is provided with several buffer pads 7-2, and the driving cylinder 6-1 and limiting cylinder 6-2 are both arranged on the buffer pad 7-2; the buffer support plate 7-1 serves as the load-bearing plate and reduces the vibration generated by the cylinder through the buffer pads 7-2.

The buffer structure 7 further comprises a vertical plate 7-3, a buffer cylinder 7-4, a piston block 7-5, an ejector pin of piston block 7-6, a guide rod 7-7, a slide cylinder of guide rod 7-8, a spring of slide cylinder 7-9, a push rod of slide cylinder 7-10, a lock of slide cylinder 7-11, and a spring of slide cylinder lock 7-12.

The vertical plate 7-3 is fixed on the buffer support plate 7-1, and one end of the vertical plate 7-3 is fixedly connected to the upper end of the buffer cylinder 7-4. The buffer cylinder 7-4 fixed by the vertical plate 7-3 is used to connect the limiting cylinder 6-2 and the limiting cylinder slider 6-5, and absorb the vibration generated by the limiting cylinder 6-2.

Figure 9:
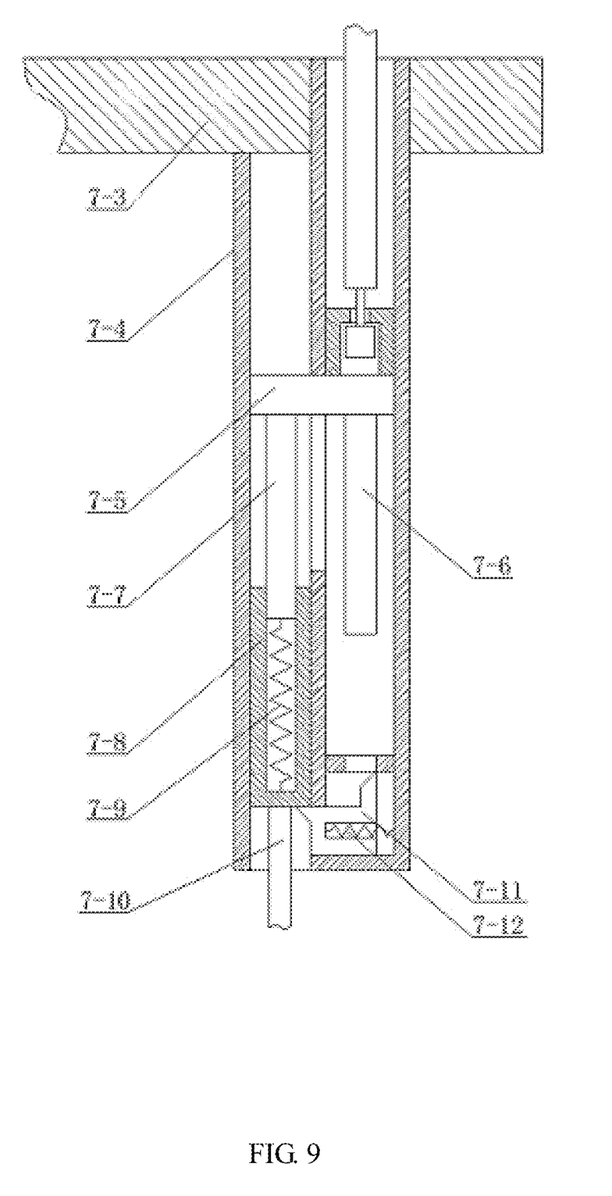
FIG. 9 is a schematic view of the internal structure of the buffer cylinder in FIG. 8.

As shown in FIG. 9, the buffer cylinder 7-4 has a double cylinder structure, and the internal sliding of the buffer cylinder 7-4 is equipped with the piston blocks 7-5 spanning its internal double cylinder structure. The extended end of the limiting cylinder 6-2 passes through the vertical plate 7-3 and enters a cylinder of the buffer cylinder 7-4 to be connected with the piston block 7-5. One side of the piston block 7-5 is equipped with an ejector pin of piston block 7-6, and the lower end of the buffer cylinder 7-4 is equipped with the lock of slide cylinder 7-11 corresponding to the ejector pin of piston block 7-6. The spring of the slide cylinder lock 7-12 is arranged between the lock of slide cylinder 7-11 and the inner wall of the buffer cylinder 7-4. The upper end of the lock of slide cylinder 7-11 is equipped with a first locking dog that matches the ejector pin of piston block 7-6, and the left end of the lock of slide cylinder 7-11 is equipped with a second locking dog that extends to the sliding path of the slide cylinder of guide rod 7-8. The extended end of the limiting cylinder 6-2 pushes the piston block 7-5 downward until the piston block 7-5 slides to the bottom of the sliding groove structure inside the buffer cylinder 7-4. The ejector pin of piston block 7-6 can contact the first locking dog of the lock of slide cylinder 7-11, and then push the lock of slide cylinder 7-11 to the right, causing the second locking dog of the lock of slide cylinder 7-11 to separate from the slide cylinder of guide rod 7-8, releasing the lock on the slide cylinder of guide rod 7-8.

The piston block 7-5 is also equipped with a guide rod 7-7, and the guide rod 7-7 is sleeved with slide cylinder of guide rod 7-8, and a spring of slide cylinder 7-9 is arranged between the guide rod 7-7 and the slide cylinder of guide rod 7-8. The lower end of the slide cylinder of guide rod 7-8 is equipped with a push rod of slide cylinder 7-10, and the push rod of slide cylinder 7-10 is connected to the limiting cylinder slider 6-5; the spring of slide cylinder 7-9 maintains a connection between the guide rod 7-7 and the slide cylinder of guide rod 7-8. When the extended end of the limiting cylinder 6-2 moves downwards, the spring of slide cylinder 7-9 is compressed to absorb the impact generated by the limiting cylinder 6-2. After the second locking dog of the lock of slide cylinder 7-11 separates from the slide cylinder of guide rod 7-8, the spring of slide cylinder 7-9 pushes the slide cylinder of guide rod 7-8 downward, causing the push rod of slide cylinder 7-10 to push the limiting cylinder slider 6-6 to slide. When the extended end of the limiting cylinder 6-2 moves upwards, the spring of slide cylinder 7-9 pulls the slide cylinder of guide rod 7-8 upwards until the lower end of the slide cylinder of guide rod 7-8 slides beyond the second locking dog of the lock of slide cylinder 7-11 and is locked again.

In this embodiment, the lower end of the push rod of slide cylinder 7-10 is rotationally connected with a push rod connecting rod. The two ends of the push rod connecting rod are respectively rotationally connected to the push rod of slide cylinder 7-10 and the limiting cylinder slider 6-5, so that the arrangement of the limiting cylinder 6-2 can change the angle relative to the limiting cylinder slider 6-5, facilitating the arrangement of the limiting cylinder 6-5.

The buffer cylinder 7-4 changes the way of rigid connection and direct driving between the limiting cylinder 6-2 and the limiting cylinder slider 6-5 to the way that when the limiting cylinder 6-2 extends, the spring of slide cylinder 7-9 accumulates force; when the limiting cylinder 6-2 stops, the spring of slide cylinder 7-9 releases the accumulated force to push the limiting cylinder slider 6-5. Through the accumulation of force by the spring of slide cylinder 7-9, the vibration generated by the extension of the limiting cylinder 6-2 is absorbed, while ensuring the process of pushing the limiting cylinder slider 6-5.

Figure 10:
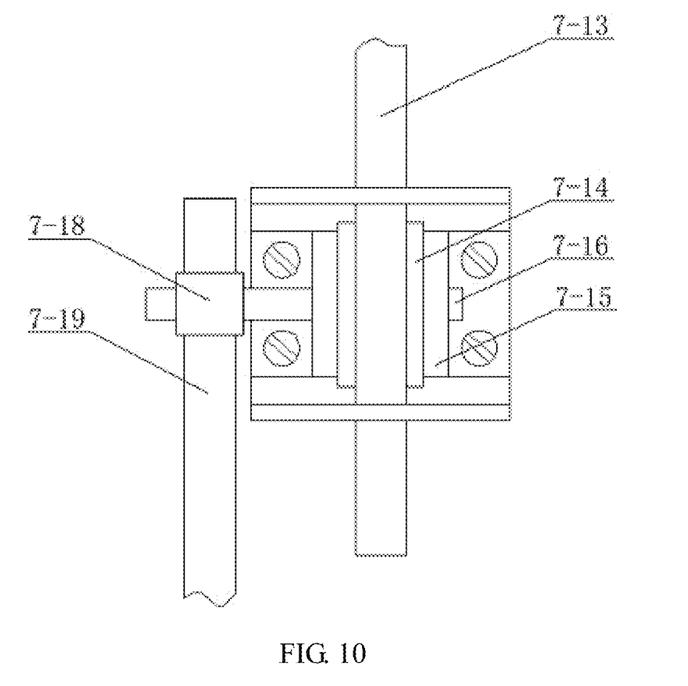
FIG. 10 is a schematic view of the volute spiral structure in FIG. 8.

The buffer structure further comprises a first rack 7-13, a first gear 7-14, a gear carrier 7-15, a gear shaft 7-16, a volute spiral spring 7-17, a second gear 7-18, and a second rack 7-19.

Figure 11:
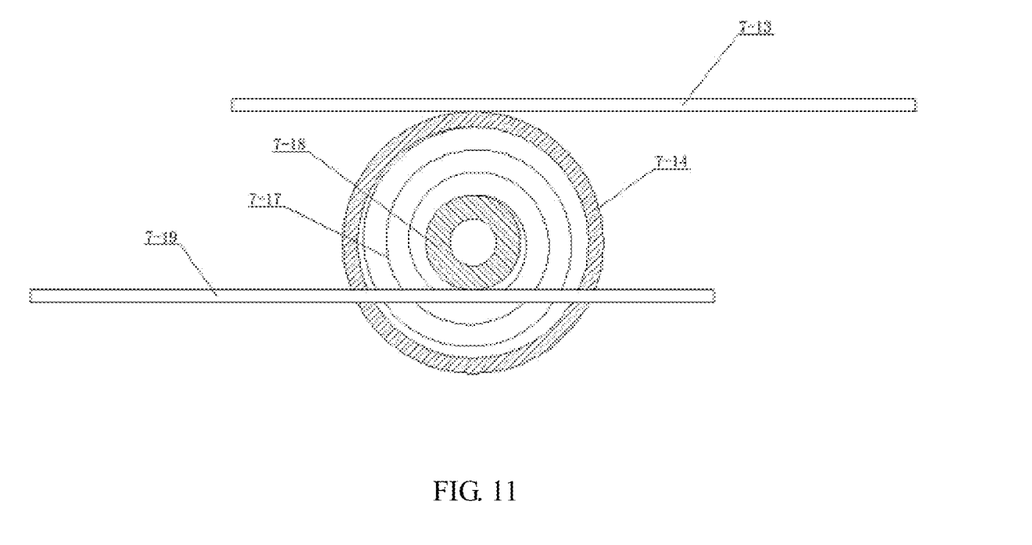
FIG. 11 is a schematic diagram of the principle of the volute spiral structure.

The volute spiral structure composed of volute spiral spring 7-17 as the core changes the way of rigid connection and direct driving between the driving cylinder 6-1 and the driving cylinder slider 6-3 to the way that when the driving cylinder 6-1 extends, the volute spiral spring 7-17 accumulates force; when the driving cylinder 6-1 stops, the volute spiral spring 7-17 releases the accumulated force to push the driving cylinder slider 6-3. Through the accumulation of force by the volute spiral spring 7-17, the vibration generated by the extension of the driving cylinder 6-1 is absorbed, while ensuring the process of pushing the driving cylinder slider 6-3.

As shown in FIGS. 10 and 11, the upper end of the first rack 7-13 is connected with the extended end of the driving cylinder 6-1, and the lower end of the first rack 7-13 is engaged with the first gear 7-14. The first gear 7-14 is a hollow gear, and the first gear 7-14 is rotatably arranged on the gear carrier 7-15. The first gear 7-14 is internally equipped with a gear shaft 7-16 coaxially, and the volute spiral spring 7-17 is arranged between the first gear 7-14 and the gear shaft 7-16. One end of the gear shaft 7-16 extends out of the gear carrier 7-15 and is connected with the second gear 7-18, the second gear 7-18 is engaged with the second rack 7-19 and the lower end of the second rack 7-19 is connected with the driving cylinder slider 6-3.

When the extended end of the driving cylinder 6-1 pushes on the first gear rack 7-13 downwards, the volute spiral spring 7-17 accumulates force and causes the gear shaft 7-16 to rotate, which changes the rigid connection between the driving cylinder 6-1 and the driving cylinder slider 6-3 to the buffer connection with the volute spiral spring 7-17, reducing the vibration generated by the impact by the driving cylinder 6-1.

Specifically, a movable connection allowing radial movement is used the between the driving cylinder 6-1 and the first rack 7-13, and between the limiting cylinder 6-2 and the piston block 7-5.

Specifically, as shown in FIG. 9, the extended end of the driving cylinder 6-1 is fixedly connected to a connector of driving cylinder, and the first rack 7-13 is provided with a driving cylinder connector slot corresponding to the driving cylinder connector, and the driving cylinder connector slot is a slot with an allowance for the movement of the driving cylinder connector.

Specifically, the extended end of the limiting cylinder 6-2 is fixedly connected to a connector of limiting cylinder, and the piston block 7-5 is provided with a limiting cylinder connector slot corresponding to the limiting cylinder connector, and the limiting cylinder connector slot is a slot with an allowance for the movement of the limiting cylinder connector.

There is an allowance between the connector slot and the connector, which can absorb the radial vibration displacement generated by the cylinder while ensuring the radial connection.

Specifically, the driving structure 6 further comprises a driving cylinder slide 6-4, a limiting cylinder slide 6-6, a fixing plate of the driving structure 6-7, a rack slider 6-8, a rack slide 6-9, a rack connecting block 6-10, a limiting contact block 6-11, and a driving rack 6-12.

Specifically, the amplitude-modulating probe card comprises a probe 1, a probe board 2, a circuit board 3, and an amplitude-modulating structure 4. The probe 1 is fixed on the probe board 2, one end of the probe 1 is connected to the circuit board 3, and the other end of the probe 1 is clamped on the amplitude-modulating structure 4.

Embodiment 6

This embodiment is an embodiment of a probe card amplitude-modulating method.

This embodiment discloses a probe card amplitude-modulating method, which is applied to an amplitude-modulating probe card disclosed in the embodiment 1. The method can achieve amplitude modulation of the probe card, adapt to the detection needs of different numbers of contacts, and make the probe card universal.

A probe card amplitude-modulating method includes the following steps:

Step a: Determine the amplitude modulation width: Define the number of probes corresponding to the main roller 4-1 of the amplitude-modulating structure 4 as the basic amplitude, and make the difference between the number of probes required for the chip to be tested and the basic amplitude to obtain the amplitude modulation width; Preset the probe card with a basic amplitude to meet the needs of the majority of contact detections and the detection needs with more contacts can be met by increasing the number of probes on the side of the side of the basic amplitude.

Step b; Determine the number of amplitude-modulating boards: From the main roller 4-1 to the direction away from the main roller 4-1, add the number of probes on the amplitude-modulating board to obtain the adjusted width, until the adjusted width covers the amplitude modulation width. The number of amplitude-modulating boards participating in the addition is the number of amplitude-modulating boards 4-2; after determining the number of probes that need to be added, compare the number of probes that need to be added with the number of probes fixed on the amplitude-modulating board 4-2, and determine the amplitude-modulating board 4-2 that needs to be moved. With multiple probes fixed on the amplitude-modulating board 4-2, add the number of probes that need to be moved on the amplitude-modulating board 4-2 until it covers the number of contacts that need to be detected.

Step c: Determine the angle of the amplitude-modulating shaft: By rotating the amplitude-modulating shaft 4-6, when the amplitude-modulating board 4-2 farthest from the main roller 4-1 is rotated out of the eccentric notch of its corresponding eccentric roller 4-8, the angle at which the eccentric roller 4-8 rotates from its initial position is used as the angle of the amplitude-modulating shaft; the amplitude-modulating probe card moves the amplitude-modulating board 4-2 through the rotation of the amplitude-modulating shaft 4-6. After determining the amplitude-modulating shaft 4-2 that needs to be moved, the rotation angle of the amplitude-modulating shaft 4-6 is determined by the angle of the corresponding amplitude-modulating shaft 4-6 that needs to be rotated.

Step d: Amplitude modulation drive: Rotate the amplitude-modulating shaft 4-6, and the amplitude-modulating shaft 4-6 drives the main roller 4-7 and eccentric roller 4-8 to rotate. The amplitude-modulating board 4-2 corresponding to the main roller 4-7 is fixed, and the probe 1 on the amplitude-modulating board 4-2 is located in the detection position. The amplitude-modulating board 4-2 corresponding to the eccentric roller 4-8 rotates out of the eccentric notch of the corresponding eccentric roller 4-8, and moves downward under the push of the eccentric roller 4-8; the rotation angle of the amplitude-modulating shaft 4-6 corresponds to the number of eccentric rollers 4-8 pushed. Rotate the amplitude-modulating 4-6 according to the rotation angle of the amplitude-modulating shaft 4-6 determined in step c.

Step e: Probe deformation: The amplitude-modulating board 4-2 moves downward, driving the probe head 1-1 of the probe 1 to move downward. The fixed wire 1-3 in the probe 1 is fixed, and the bent wire 1-2 connecting the probe head 1-1 and the fixed wire 1-2 undergoes elastic deformation. The probe 1 moves downward from the ready position to the detection position, thereby increasing the basic amplitude of the probe card to the side to the amplitude modulation width.

Specifically, several probes 1 are fixed on the amplitude-modulating board 4-2 corresponding to the eccentric roller 4-8. When determining the number of amplitude-modulating boards, the number of probes 1 corresponding to the amplitude-modulating board 4-2 is added until the adjusted width is not less than the amplitude modulation width.

Specifically, when rotating the amplitude-modulating shaft 4-6, the adjusting wheel 5-3 is used to drive the rotation of the amplitude-modulating shaft 4-6, while the speed reduction structure 5 connected between the adjusting wheel 5-3 and the amplitude-modulating shaft 4-6 is used for speed reduction.

Specifically, as shown in FIGS. 1 to 5, an amplitude-modulating probe card is used for amplitude modulation, and the amplitude-modulating probe card comprises a probe 1, a probe board 2, a circuit board 3, and an amplitude-modulating structure 4. The probe 1 is fixed on the probe board 2, one end of the probe 1 is connected to the circuit board 3, and the other end of the probe 1 is clamped on the amplitude-modulating structure 4.

Specifically, the probe 1 comprises a probe head 1-1, a bent wire 1-2 and a fixed wire 1-3. One end of the probe head 1-1 is a circular probe used for detection, the middle of the probe head 1-1 is clamped on the amplitude-modulating structure 4, the other end of the probe head 1-1 is connected to one end of the bent wire 1-2, the middle of the bent wire 1-2 is a bent elastic structure, the other end of the bent wire 1-2 is connected to one end of the fixed wire 1-3, the middle of the fixed wire 1-3 is fixed on the probe board 2, and the other end of the fixed wire 1-3 is connected to the circuit board 3; The amplitude-modulating structure 4 comprises a fixed board 4-1, an amplitude-modulating board 4-2, an amplitude modulation connecting board 4-3, a reed 4-4, an amplitude modulation clamp board 4-5, an amplitude-modulating shaft 4-6, a main roller 4-7, and an eccentric roller 4-8.

The fixed board 4-1 is fixedly connected to the circuit board 3, and the upper end of the amplitude-modulating board 4-2 is fixedly connected to the amplitude modulation connecting board 4-3, the lower end of the amplitude-modulating board 4-2 vertically passes through the fixed board 4-1, circuit board 3, and probe board 2, and then is fixedly connected to the probe 1. A reed 4-4 is set between the lower end of the amplitude modulation connecting board 4-3 and the fixed board 4-1, and the side of the amplitude modulation connecting board 4-3 is clamped by the amplitude modulation clamp plate 4-5, forming a sliding structure perpendicular to the fixed board 4-1. The amplitude-modulating shaft 4-6 is arranged above the amplitude modulation connecting board 4-3, and a main roller 4-7 and an eccentric roller 4-8 are arranged on the amplitude-modulating shaft 4-6;

The multiple amplitude modulation connecting boards 4-3 are arranged along the probes 1 with one amplitude modulation connecting board 4-3 arranged corresponding to the main roller 4-7, and with the remaining amplitude modulation connecting boards 4-3 arranged corresponding to the eccentric roller 4-8;

The main roller 4-7 is a circular roller arranged coaxially on the amplitude-modulating shaft 4-6, and the eccentric roller 4-8 is provided with a virtual circle inside it, and the eccentric roller 4-8 is provided with an eccentric notch that reaches the virtual circle on its edge. The eccentric notches of the multiple eccentric rollers 4-8 increase sequentially along the direction from the main roller 4-7 to the direction away from the main roller 4-7, and one side of the multiple eccentric notches is aligned.

It should be noted that in the above embodiments, as long as the technical solutions are not contradictory, they can be arranged and combined. Since those skilled in the art can exhaust all the results of permutation and combination according to the knowledge of permutation and combination mathematics learned in high school, these results are not listed one by one in this application, but it should be understood that every permutation and combination result is recorded in this application.

It should also be noted that the above embodiments are only illustrative illustrations of the present patent and do not limit its scope of protection. Those skilled in the art can also make partial changes to them, but as long as they do not exceed the spirit of the present patent, they are within the scope of protection of the present patent.

The invention claimed is:

1. An amplitude-modulating probe card, wherein it comprises a probe, a probe board, a circuit board, and an amplitude-modulating structure; the probe is fixed on the probe board, one end of the probe is connected to the circuit board, and the other end of the probe is clamped on the amplitude-modulating structure;

the probe comprises a probe head, a bent wire and a fixed wire; one end of the probe head is a circular probe used for detection, the middle of the probe head is clamped on the amplitude-modulating structure, the other end of the probe head is connected to one end of the bent wire, the middle of the bent wire is an elastic structure, the other end of the bent wire is connected to one end of the fixed wire, the middle of the fixed wire is fixed on the probe board, and the other end of the fixed wire is connected to the circuit board;

the amplitude-modulating structure comprises a fixed board, an amplitude-modulating board, an amplitude modulation connecting board, a reed, an amplitude modulation clamp board, an amplitude-modulating shaft, a main roller, and an eccentric roller roller; the fixed board is fixedly connected to the circuit board, and the upper end of the amplitude-modulating board is fixedly connected to the amplitude modulation connecting board, the lower end of the amplitude-modulating board vertically passes through the fixed board, circuit board, and probe board, and then is fixedly connected to the probe; a reed is set between the lower end of the amplitude modulation connecting board and the fixed board, and the side of the amplitude modulation connecting board is clamped by the amplitude modulation clamp plate, forming a sliding structure perpendicular to the fixed board; the amplitude-modulating shaft is arranged above the amplitude modulation connecting board, and a main roller and an eccentric roller are arranged on the amplitude-modulating shaft;

the multiple amplitude modulation connecting boards are arranged along the probes with one amplitude modulation connecting board arranged corresponding to the main roller, and with the remaining amplitude modulation connecting boards arranged corresponding to the eccentric roller;

the main roller is a circular roller arranged coaxially on the amplitude-modulating shaft, and the eccentric roller is provided with a virtual circle inside it, and the eccentric roller is provided with an eccentric notch that reaches the virtual circle on its edge; the eccentric notches of the multiple eccentric rollers increase sequentially along the direction from the main roller to the direction away from the main roller, and one side of the multiple eccentric notches is aligned.

2. An amplitude-modulating probe card according to claim 1, wherein: the probe board comprises a board body, a probe groove groove, a pressing plate groove, and a pressing plate; the board body is provided with several probe grooves to accommodate the probes, the pressing plate groove is arranged across the probe groove, the pressing plate is arranged in the pressing plate groove, and the pressing plate is fixedly connected to the board body.

3. An amplitude-modulating probe card according to claim 2, wherein: the bottom of the probe groove and the bottom of the pressing plate are provided with gaps for clamping the probes.

4. An amplitude-modulating probe card according to claim 1, wherein: it also comprises a speed reduction structure, and the speed reduction structure is arranged on the fixed board and the speed reduction structure is connected to the amplitude-modulating shaft.

5. An amplitude-modulating probe card according to claim 4, wherein: the speed reduction structure comprises a reduction frame, a reduction gear and an adjusting wheel; the reduction frame is fixed on the fixed board, the reduction frame is provided with several reduction gears, the adjustment wheel is located on the outside of the reduction frame, and the adjusting wheel is connected with the amplitude-modulating shaft through the reduction gear.

6. An amplitude-modulating probe card according to claim 1, wherein: it further comprises a driving structure and the driving structure is arranged above the probe card, and the driving structure comprises a driving cylinder and a limiting cylinder, the driving cylinder is used to drive the amplitude-modulating structure, several limiting cylinders are arranged sequentially on the stroke of the driving cylinder to limit the stroke of the driving cylinder.

7. An amplitude-modulating probe card according to claim 6, wherein: the driving structure is also provided with a buffer structure.

8. A probe of an amplitude-modulating probe card, wherein: it comprises a probe head, a bent wire and a fixed wire; one end of the probe head is a circular probe used for detection, the middle of the probe head is clamped on the amplitude-modulating structure, the other end of the probe head is connected to one end of the bent wire, the middle of the bent wire is a bent elastic structure, the other end of the bent wire is connected to one end of the fixed wire, the middle of the fixed wire is fixed on the probe board, and the other end of the fixed wire is connected to the circuit board.

9. The amplitude-modulating structure of an amplitude-modulating probe card, wherein: it comprises a fixed board, an amplitude-modulating board, an amplitude modulation connecting board, a reed, an amplitude modulation clamp board, an amplitude-modulating shaft, a main roller, and an eccentric roller; the fixed board is fixedly connected to the circuit board, and the upper end of the amplitude-modulating board is fixedly connected to the amplitude modulation connecting board, the lower end of the amplitude-modulating board vertically passes through the fixed board, circuit board, and probe board, and then is fixedly connected to the probe; a reed is set between the lower end of the amplitude modulation connecting board and the fixed board, and the side of the amplitude modulation connecting board is clamped by the amplitude modulation clamp plate, forming a sliding structure perpendicular to the fixed board; the amplitude-modulating shaft is arranged above the amplitude modulation connecting board, and a main roller and an eccentric roller are arranged on the amplitude-modulating shaft.

* * * * *